(12) United States Patent
Gervasi

(10) Patent No.: US 8,065,475 B2
(45) Date of Patent: Nov. 22, 2011

(54) REGISTERED DUAL IN-LINE MEMORY MODULE HAVING AN EXTENDED REGISTER FEATURE SET

(75) Inventor: William M. Gervasi, Ladera Ranch, CA (US)

(73) Assignee: Stec, Inc., Santa Ana, CA (US)

( * ) Notice: Subject to any disclaimer, the term of this patent is extended or adjusted under 35 U.S.C. 154(b) by 171 days.

(21) Appl. No.: 11/259,539

(22) Filed: Oct. 25, 2005

(65) Prior Publication Data

US 2006/0259678 A1 Nov. 16, 2006

Related U.S. Application Data

(60) Provisional application No. 60/697,330, filed on Jul. 6, 2005, provisional application No. 60/680,257, filed on May 11, 2005.

(51) Int. Cl.
 *G06F 12/00* (2006.01)
(52) U.S. Cl. ............. 711/104; 711/2; 711/5; 711/154; 711/170; 711/E12.001; 365/189.05
(58) Field of Classification Search .............. 711/205
 See application file for complete search history.

(56) References Cited

U.S. PATENT DOCUMENTS

| | | | | |
|---|---|---|---|---|
| 5,900,757 A * | 5/1999 | Aggarwal et al. | ............ | 327/198 |
| 6,256,235 B1 * | 7/2001 | Lee | ............ | 365/189.11 |
| 7,307,863 B2 * | 12/2007 | Yen et al. | ............ | 365/63 |
| 2003/0128596 A1 * | 7/2003 | Peterson et al. | ......... | 365/189.11 |
| 2004/0243753 A1 * | 12/2004 | Horowitz et al. | ............ | 710/301 |
| 2005/0000071 A1 * | 1/2005 | Huntington | ................ | 29/25.42 |
| 2005/0108468 A1 * | 5/2005 | Hazelzet et al. | ............ | 711/105 |
| 2005/0262289 A1 * | 11/2005 | Okuda | ......... | 711/100 |

OTHER PUBLICATIONS

Philips, Product Data Sheet for SSTU32864 1.8 V configurable registered buffer for DDR2 RDIMM applications, Oct. 2004, pp. 1-21, http://www.nxp.com/acrobat_download/datasheets/SSTU32864_2.pdf.*
IBM Technical Disclosure Bulletin, Accession No. NA920391, "Programmable Support for Controlling Memory Configurations in Personal Computers", Mar. 1992, vol. 34, Issue 10A, pp. 91-94.*
Super Talent "512MB (x72, ECC) 184-Pin Registered DDR SDRAM DIMM", Oct. 2004, pp. 1-9.*
Micron, "512MB, 1GB (x72, ECC, SR) PC3200 184-Pin DDR SDRAM RDIMM", Sep. 2004, p. 11.*

* cited by examiner

*Primary Examiner* — Pierre-Michel Bataille
*Assistant Examiner* — Ralph A Verderamo, III
(74) *Attorney, Agent, or Firm* — McDermott Will & Emery LLP

(57) ABSTRACT

A registered dual in-line memory module is configured with multiple random access memory chips and a DRAM register configured to receive address and control signals from a memory controller. The DRAM register distributes the address and control signals to the random access memory chips, thereby providing the memory controller access to the chips. The module further includes a control register configured to store control bits for setting operating modes of the registered dual in-line memory module. The control bits are software programmable using signals received from the memory controller.

25 Claims, 9 Drawing Sheets

REGISTERED DUAL IN-LINE MEMORY MODULE HAVING AN EXTENDED REGISTER FEATURE SET

This application claims the benefit of U.S. Provisional Application No. 60/680,257, filed May 11, 2005, and U.S. Provisional Application No. 60/697,330, filed Jul. 6, 2005, which are hereby incorporated herein by reference.

FIELD OF THE INVENTION

The invention concerns computer memory modules. More particularly, the invention concerns a registered dual in-line memory module having an extended register feature set.

BACKGROUND OF THE INVENTION

Dual in-line memory modules (DIMMs) are used in a number of different types of computing systems. DIMMs include multiple dynamic random access memory (DRAM) chips arranged to provide 64 data bits to a data bus within a computing system. The DRAM chips typically provide one (single rank), two (dual rank) or four (quad rank) 64-bit data areas on the DIMM depending on the type and number of DRAM chips used. Optionally, DIMMs include one or more DRAM chips to provide error correction code (ECC) check bits, which are used to verify the integrity of data stored on a DIMM.

Demanding computing systems such as servers and workstations require a high level of performance and reliability. To meet these requirements, these types of computing systems are often equipped with registered DIMMs. Registered DIMMs use a register component to synchronize address and control signals received from a system memory controller and distribute those signals to the DRAM chips on the DIMM. FIG. 1 is a block diagram depicting the main components of one example of a registered DIMM together with representations of some of the signals communicated between the components.

As shown in FIG. 1, registered DIMM 10 includes nine DRAM chips 11, which provide 64 data bits and 8 ECC check bits. Also included in registered DIMM 10 are register component 12 and phase-locked loop (PLL) component 13. Register component 12 receives address and control signals driven by a system memory controller (not shown) to access DRAM chips 11. Register component 12 synchronizes the address and control signals received from the system memory controller and distributes these signals to each of DRAM chips 11. PLL component 13 receives a CLOCK IN signal from the computing system and distributes a CLOCK OUT signal to register component 12 and each of DRAM chips 11. Using a feedback control system, PLL component 13 maintains the CLOCK OUT signal in a fixed-phase relationship with the CLOCK IN signal.

Register component 12 has a feature set that affects the performance and operation of registered DIMM 10. For example, one feature of register component 12 is its output drive strength which is set based on performance requirements and the number of DRAM chips the address and control signals must be driven to by the register component. Other features include command filters and mirroring settings. However, the register feature sets of conventional registered DIMMs are limited and are typically hard wired during assembly. Accordingly, the feature sets of conventional register components generally are not configurable by the end user. This limits the end user's ability to obtain performance improvements from the registered DIMM using existing and potential features of the register component.

SUMMARY OF THE INVENTION

The present invention addresses the shortcomings of conventional registered DIMMs by providing a way to greatly expand the feature set of the register component without adding additional pins to the packaging of the module. To achieve this expanded feature set, operating modes that were previously hard wired at the time of assembly are controlled using control bits stored in a control register component. By using register memory locations to set operating modes of the register component, the feature set can be greatly increased over conventional systems that require individual pins for each operating mode to be controlled. The invention further increases the functionality of the registered DIMM by providing software access to these control bits using address and control signals driven by a system memory controller to the register component.

According to one aspect of the invention, a registered dual in-line memory module is provided that includes multiple random access memory chips and a DRAM register configured to receive address and control signals from a memory controller and distribute the address and control signals to the random access memory chips. A control register is configured to store up to a plurality of control bits for setting operating modes of the registered dual in-line memory module. The control bits are programmable using signals received from the memory controller.

The foregoing summary of the invention has been provided so that the nature of the invention can be understood quickly. A more detailed and complete understanding of the preferred embodiments of the invention can be obtained by reference to the following detailed description of the invention together with the associated drawings.

DETAILED DESCRIPTION OF THE INVENTION

Figure 1:
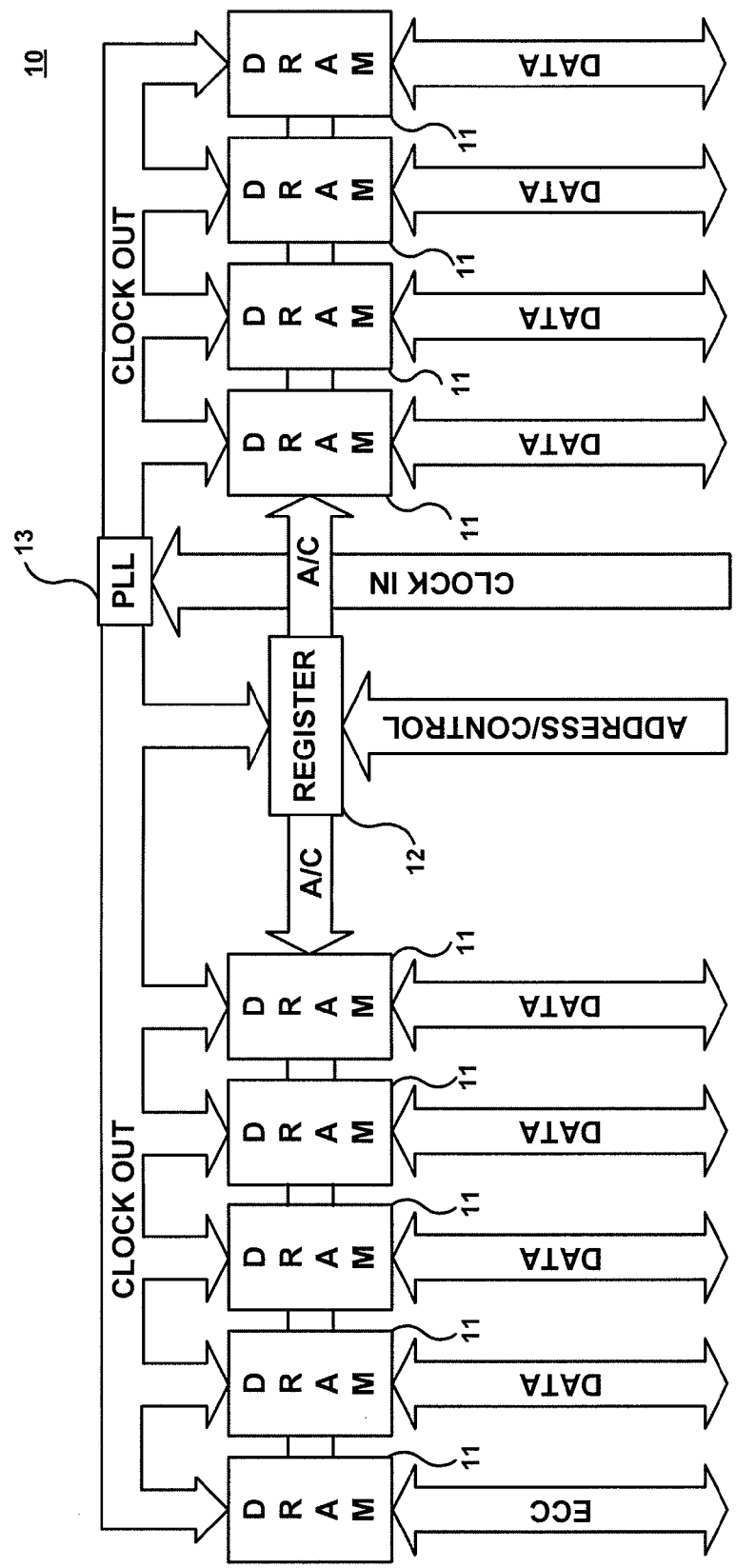
FIG. 1 is a block diagram depicting the main components of a registered dual in-line memory module.

The invention will now be described more fully with reference to the accompanying drawings, wherein like reference numerals refer to like elements throughout the drawings. The following description includes preferred embodiments of the invention provided to describe the invention by way of example to those skilled in the art.

Figure 2:
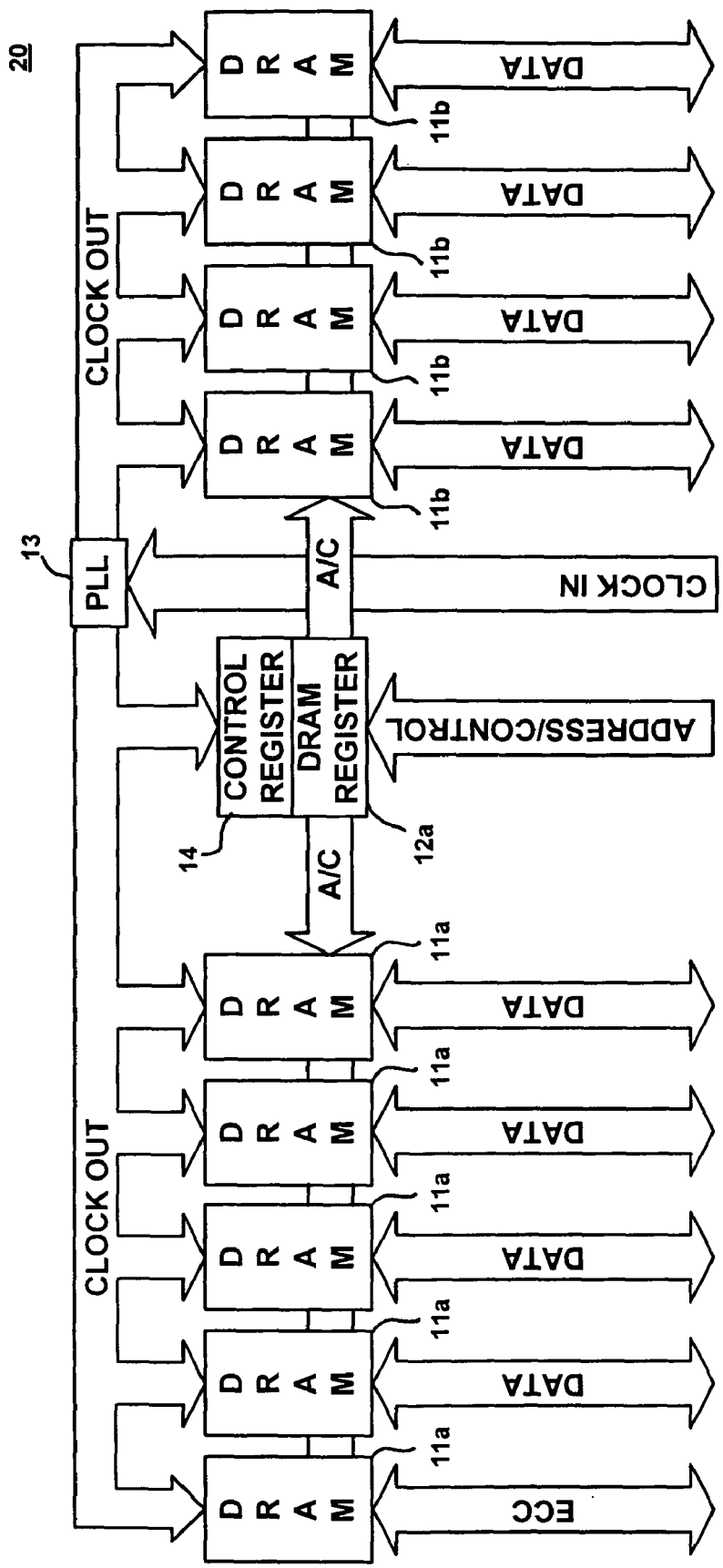
FIG. 2 is a block diagram depicting the main components of a registered dual in-line memory module according to one embodiment of the invention.

FIG. 2 is a block diagram depicting the main components of registered DIMM 20, together with representations of the signals communicated between components, according to one embodiment of the present invention. Similar to registered DIMM 10 depicted in FIG. 1, registered DIMM 20 includes nine DRAM chips 11a and 11b. In this example, DRAM chips 11a and 11b represent ×8 synchronous DRAM chips having any of a number of data capacities known and used by those skilled in the art. It is noted, however, that this arrangement represents only one embodiment of the invention. One skilled in the art will recognize that other configurations having different numbers and types of DRAM chips, such as 18×4 synchronous DRAM chips, for example, can be used without departing from the scope of the invention.

Also included in registered DIMM 20 are DRAM register component 12a and PLL component 13. Similar to registered DIMM 10 depicted in FIG. 1, DRAM register component 12a receives address and control signals driven by a system memory controller (not shown) to access DRAM chips 11a and 11b. DRAM register component 12 synchronizes the address and control signals received from the system memory controller and distributes these signals to each of DRAM chips 11a and 11b. PLL component 13 receives a CLOCK IN signal from the computing system and distributes a CLOCK OUT signal to register component 12 and each of DRAM chips 11a and 11b. Using a feedback control system, PLL component 13 maintains the CLOCK OUT signal in a fixed-phase relationship with the CLOCK IN signal.

As mentioned above, the feature set of register component 12 in registered DIMM 10 is fixed at the time of manufacture. To expand the functionality and performance capabilities of registered DIMM 20, the invention uses control bits stored in control register component 14 to set features and operating modes of DRAM register component 12a. DRAM register component 12a and control register component 14 can be integrated into a single component to reduce the number of chips and inter-chip connections on the DIMM, or can be implemented as individual components with appropriate signals communicated between them.

In a preferred embodiment of the invention, the control bits are organized into control words which are addressable using address signals received from the system memory controller. By asserting a unique select signal together with appropriate address signals, the system memory controller can access the control bits stored in control register component 14 to set features and operating modes of DRAM register 12a. Table 1 shows one example of the signals used to access and address the control words stored in control register component 14. It is to be understood that Table 1 represents one example of encoding used to access the control words. One skilled in the art will recognize other encoding schemes capable of accessing the control words without departing from the scope of the invention.

TABLE 1

| Control Word | Symbol | /S0 | /S1 | A2 | A1 | A0 | Meaning |
|---|---|---|---|---|---|---|---|
| None | n/a | H | X | X | X | X | No control word access |
| None | n/a | X | H | X | X | X | No control word access |
| Control Word 0 | RC0 | L | L | L | L | L | Output Driver Control Word |
| Control Word 1 | RC1 | L | L | L | L | H | Clock Driver Control Word |
| Control Word 2 | RC2 | L | L | L | H | L | Timing Control Word |
| Control Word 3 | RC3 | L | L | L | H | H | Thermal Sensor Control Word |
| Control Word 4 | RC4 | L | L | H | L | L | Feature A |
| Control Word 5 | RC5 | L | L | H | L | H | Feature B |
| Control Word 6 | RC6 | L | L | H | H | L | Feature C |
| Control Word 7 | RC7 | L | L | H | H | H | Feature D |

Figure 3:
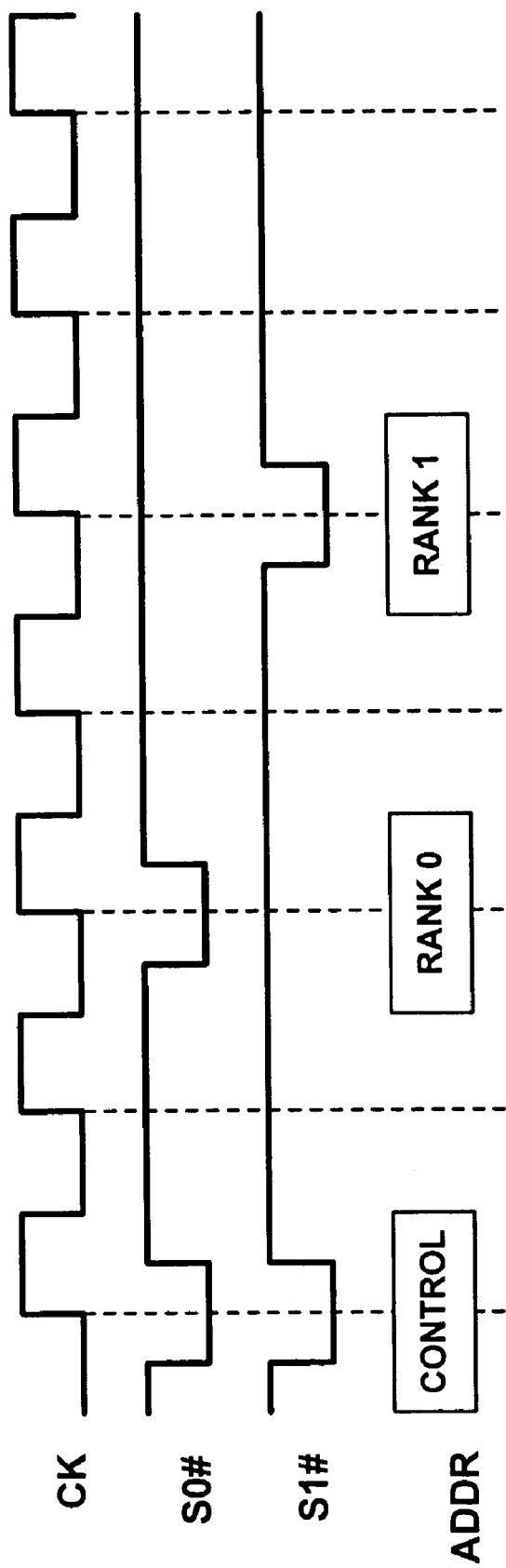
FIG. 3 is a timing chart depicting the signals asserted to gain access to control bits.

A unique aspect of the invention is that the feature set of DRAM register component 12a is expanded over conventional systems by using stored control bits to set features rather than pins on the DRAM register component itself. These control bits are software accessible through the system memory controller by asserting a unique combination of signals that is not used in conventional operation of registered DIMMs. For example, as shown in Table 1, access to the control words and the control bits therein are obtained by the simultaneous assertion of two chip select signals /S1 and /S0. This otherwise illegal signal combination causes DRAM register component 12a to direct specific address and control signals received from the system memory controller to control register component 14, thereby providing software access to the control bits stored therein. FIG. 3 is a timing chart showing this operation of accessing the control bits. As shown in FIG. 3, when either of the chip select signals /S1 or/S0 are selected individually, the address and control signals are directed to the respective rank of memory corresponding to the asserted signal. However, when both chip select signals /S1 and /S0 are simultaneously asserted, the address and control signals are directed to control register component 14.

To select the desired control word for which access is sought, appropriate address signals are asserted by the system memory controller and decoded by control register 14. In the example shown in Table 1, address signals A2, A1 and A0 are used to select one of eight different control words depending on the asserted combination of these signals. While this example uses three address signals to select from eight different control words, one skilled in the art will recognize that the number of addressable control words can be increased or decreased by using a different number of address signals.

When the chip select signals /S1 and /S0 are simultaneously asserted, the values to be programmed into the control bits of the control word identified by address signals A2, A1 and A1 are asserted on designated address and/or control lines. For example, one embodiment of the invention drives the values to be programmed on address signals A3 and A4 and bank select signals BA0 and BA1. When access is selected by the simultaneous assertion of the chip select signals, these signals are directed to control register component 14 to be programmed into the control word specified by the asserted address signals. While this example uses control words having four bits of information, other embodiments of the invention may include control words having more or less than four bits by using different numbers of address and control signals than those specified above.

Figure 4:
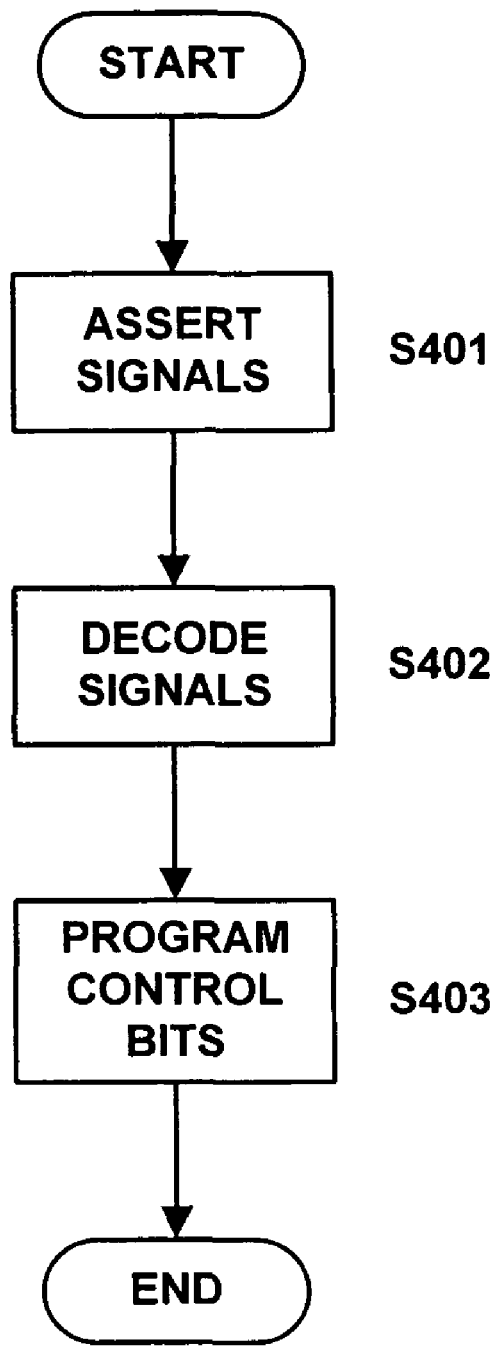
FIG. 4 is a flowchart depicting process steps used to load values into control bits.

FIG. 4 is a flowchart depicting steps used to program the control bits stored in control register component 14. In step S401, the system memory controller asserts the address and control signals necessary to access the desired control bits as described above. In step S402, DRAM register component 12a and control register component 14 decode the asserted address and control signals to identify the control bits being accessed. Finally, in step S403, the values driven on the corresponding address signals are loaded into the appropriate control bits.

The present invention is not limited to the specific signals identified above for accessing the various control words stored on control register component 14. The signals identified above were selected for one embodiment of the invention because the pins for these signals are typically centrally located on registered DIMM modules, thereby simplifying routing to control register 14. Another advantage to this embodiment of the invention is that unique combinations of existing signals are used to access and program the control words. Therefore, no additional signals need to be routed from the system memory controller to the registered DIMM to provide access to the control words. It should be recognized that other embodiments of the invention may use different signals to access and program the control words.

Each of the control words stored in control register component 14 contains control bits used to set features and operating modes of DRAM register 12a. Table 1 lists examples of feature sets controlled by some of the control words. Referring to Table 1, control word 0 contains control bits setting output driver control features; control word 1 contains control bits setting clock driver control features; control word 2 contains control bits setting timing control features; etc. These feature sets are examples of possible feature sets that can be accessed and programmed using the present invention. However, these represent only a few of the possible features that can be used to configure operating modes of registered DIMMs. As one skilled in the art will recognize, the present invention allows the extension of the feature set of the DRAM register component to be expanded by adding additional control words and/or control bits to control register component 14.

Turning now to features and operating modes set by control bits stored in control register component 14, several examples of features made possible by the present invention will now be described. These examples are intended to illustrate the benefits afforded by the invention but are not intended to limit the scope of the invention.

Simultaneous switching output currents can increase propagation delays in the outputs of DRAM register component 12a. To reduce the occurrence of all output signals being driven high or all output signals being driven low, and the accompanying increase in propagation delays, the invention includes a programmable feature of inverting the address signals driven by DRAM register component 12a to part of the DRAM chips on registered DIMM 20. Referring back to FIG. 2, when the appropriate control bit is set, the address signals driven by DRAM register component 12a to DRAM chips 11b are inverted while the address signals driven to DRAM chips 11a are left unchanged.

When DRAM chips 11a and 11b are programmed using mode register set (MRS) commands or extended mode register set (EMRS) commands, the address and control signals driven to each of the DRAM chips must be identical. Because of this requirement, the address inversion feature described above cannot be used in conventional registered DIMMs. The present invention overcomes this obstacle through its use of programmable control bits which allows the address inversion feature to be enabled or disabled by the system memory controller.

Figure 5:
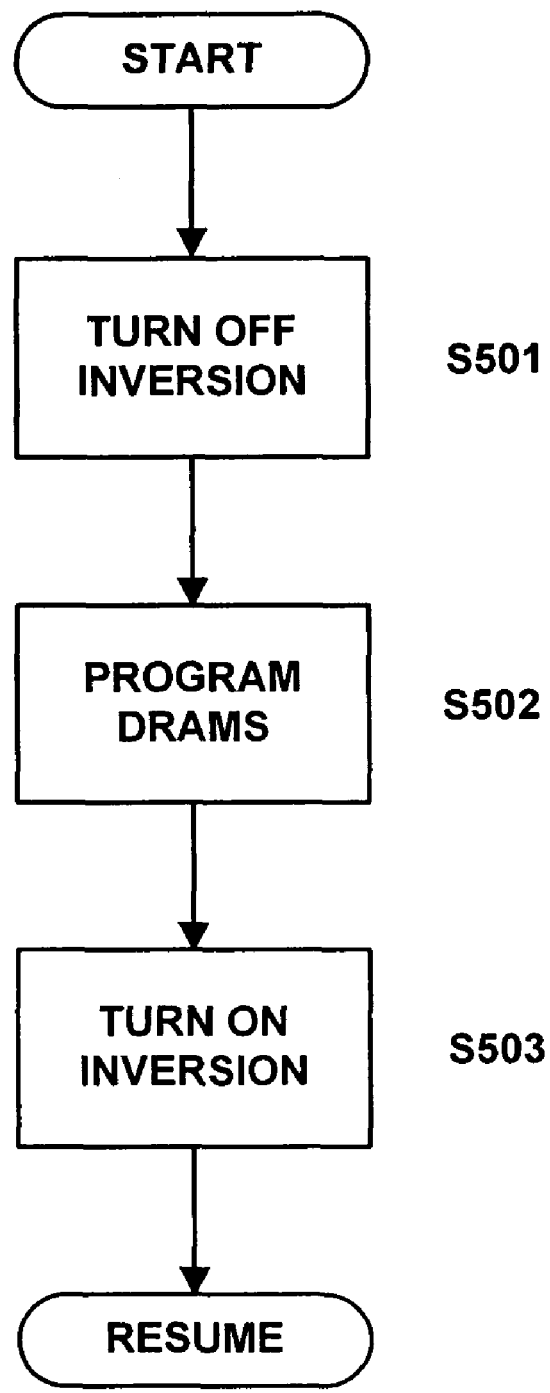
FIG. 5 is a flowchart depicting process steps used to disable address inversion during DRAM chip programming.

FIG. 5 is a flowchart depicting the basic steps of a process executed by the system memory controller to program the DRAM chips. The process begins at any time the system memory controller needs to issue MRS or EMRS commands to the DRAM chips, such as during initialization. In step S501, the system memory controller drives the appropriate address and control signals to program the control bit associated with address inversion to disable address inversion. In step S502, the system memory controller drives the address and control signals to issue the MRS or EMRS commands to the DRAM chips. Finally, in step S503, the system memory controller drives the appropriate address and control signals to program the address inversion control bit to enable address inversion. The process then completes and operation of the registered DIMM continues. In the foregoing manner, the present invention is able to take advantage of address inversion to reduce the negative effects of simultaneous switching output current while maintaining the ability to program the individual DRAM chips.

The signal buses through which DRAM register 12a distributes the address and control signals to DRAM chips 11a and 11b are typically terminated to a voltage through one or more resistors (not shown). When the signal buses are not in use, conventional registered DIMMs typically hold the address and control signals in a high or low state. Holding the address and control signals in this state generally causes power loss through the resistors. To conserve power, the invention provides a programmable feature which allows the address and control signals output by DRAM register component 12a to float to a voltage that matches the terminating voltage of the buses when the signal buses are not in use. This output float feature is set by the system memory controller driving the appropriate address and control signals to program the control bit associate with this feature.

Figure 6:
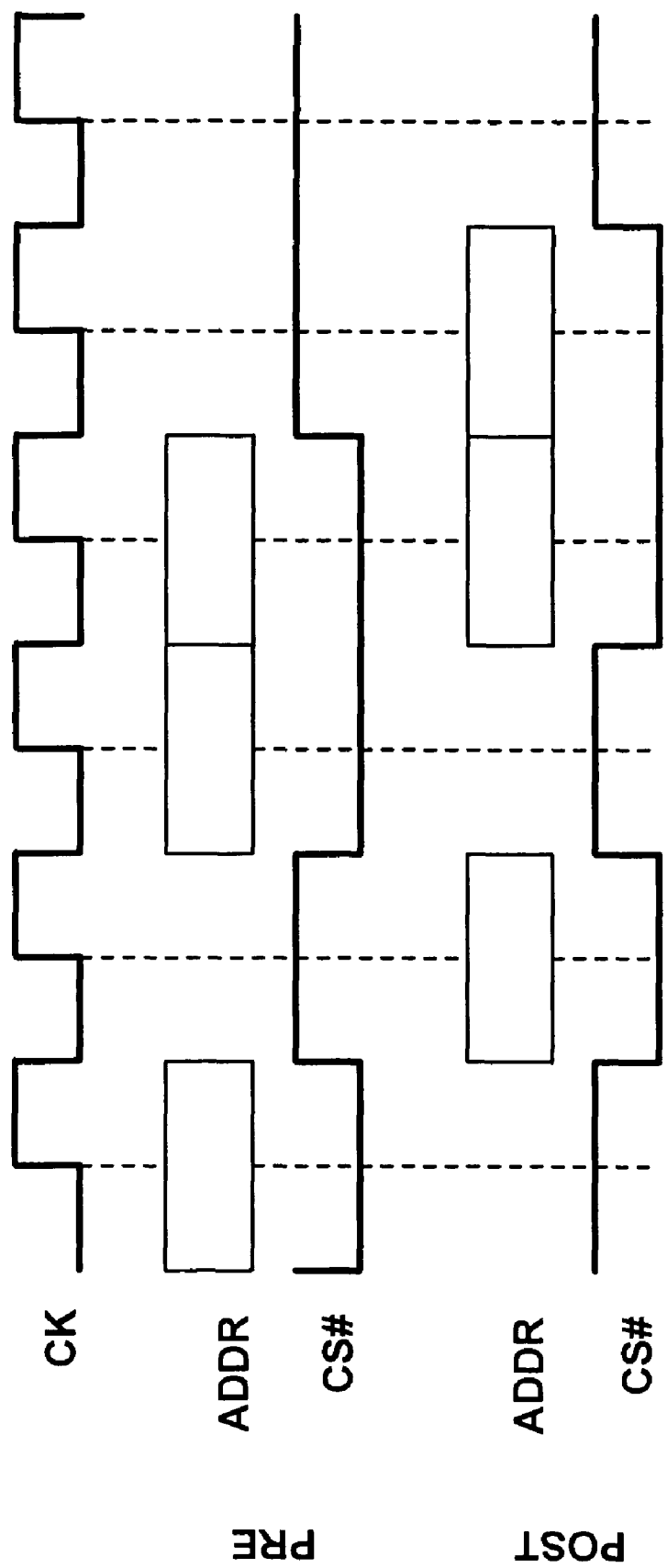
FIG. 6 is a timing chart depicting a 1T/1T timing arrangement.

Another feature provided by the present invention is the control of the output timing of DRAM register component 12a. FIG. 6 is a timing diagram showing a 1T/1T timing arrangement of a registered DIMM. The PRE address (ADDR) and chip select (CS#) signals show the timing of the signals driven by the system memory controller to the DRAM register component. The POST address and chip select signals show the timing of the signals driven by the DRAM register component to the DRAM chips. In the 1T/1T timing arrangement, the address window from the system memory controller is valid for one clock cycle, with the chip select signal bracketing the rising edge of the clock signal within the address window. Similarly, the address window from the DRAM register component is valid for one clock cycle on the next clock cycle, with the chip select signal again bracketing the rising edge of the clock signal within the address window.

Figure 7:
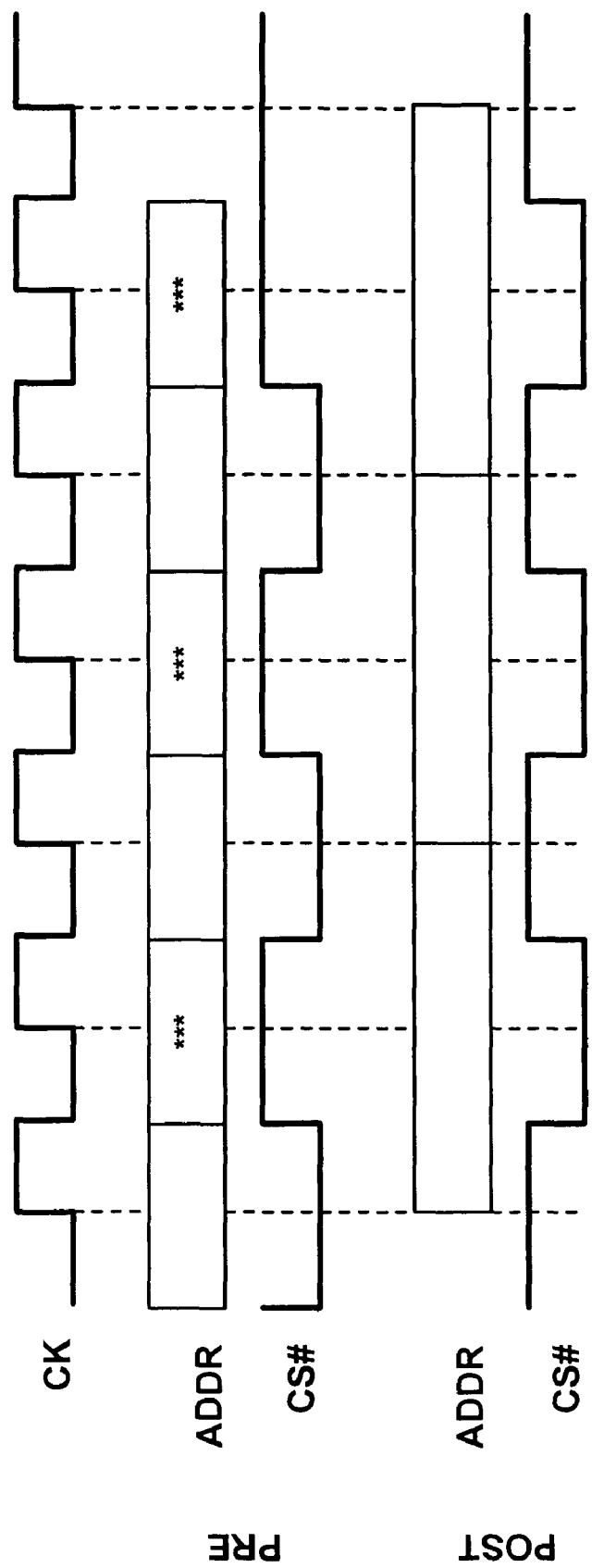
FIG. 7 is a timing chart depicting a 1T/2T timing arrangement.

Using one or more control bits, the invention provides a programmable feature that stretches the POST address valid window out to multiple clock cycles while leaving the PRE address valid window at one clock cycle. Stretching the POST address valid window provides a safer window for the DRAM chips to sample the address signals. The longer address valid window may be necessary depending on the loading within the registered DIMM and the capabilities of the DRAM chips on the module. FIG. 7 is a timing diagram showing a 1T/2T timing arrangement of a registered DIMM. As with the 1T/1T arrangement, the PRE address window is valid for one clock cycle. However, in the 1T/2T arrangement the POST address window is valid for two clock cycles. In the timing diagram shown in FIG. 7, the POST chip select signal brackets the rising clock edge centered in the address valid window. The POST address valid window can be stretched further (1T/3T, for example) by programming appropriate values in the control bits associated with output timing.

FIG. 7 shows two different groups of three PRE address valid windows. The first group is represented by the empty boxes and includes the address signal values output in the POST address valid windows shown in the figure. A second group of PRE address valid windows is represented by boxes with three asterisks centered inside. This second group of PRE address valid windows are additional address valid windows made available by the difference in PRE and POST timing. These address valid windows can be used to drive address signals to a DRAM register component different than the one to which the first group of address signals is being driven. For example, a two-rank registered DIMM having one DRAM register component for each rank can take advantage of this timing arrangement by alternating driving address signals between the two DRAM register components. During the extra clock cycle required by the DRAM register component to drive the address signals to the DRAM chips, address signals can be driven to another DRAM register component driving a different memory rank on the registered DIMM. In this manner, improved performance can be obtained despite having a POST address valid window that exceeds one clock cycle.

Figure 8:
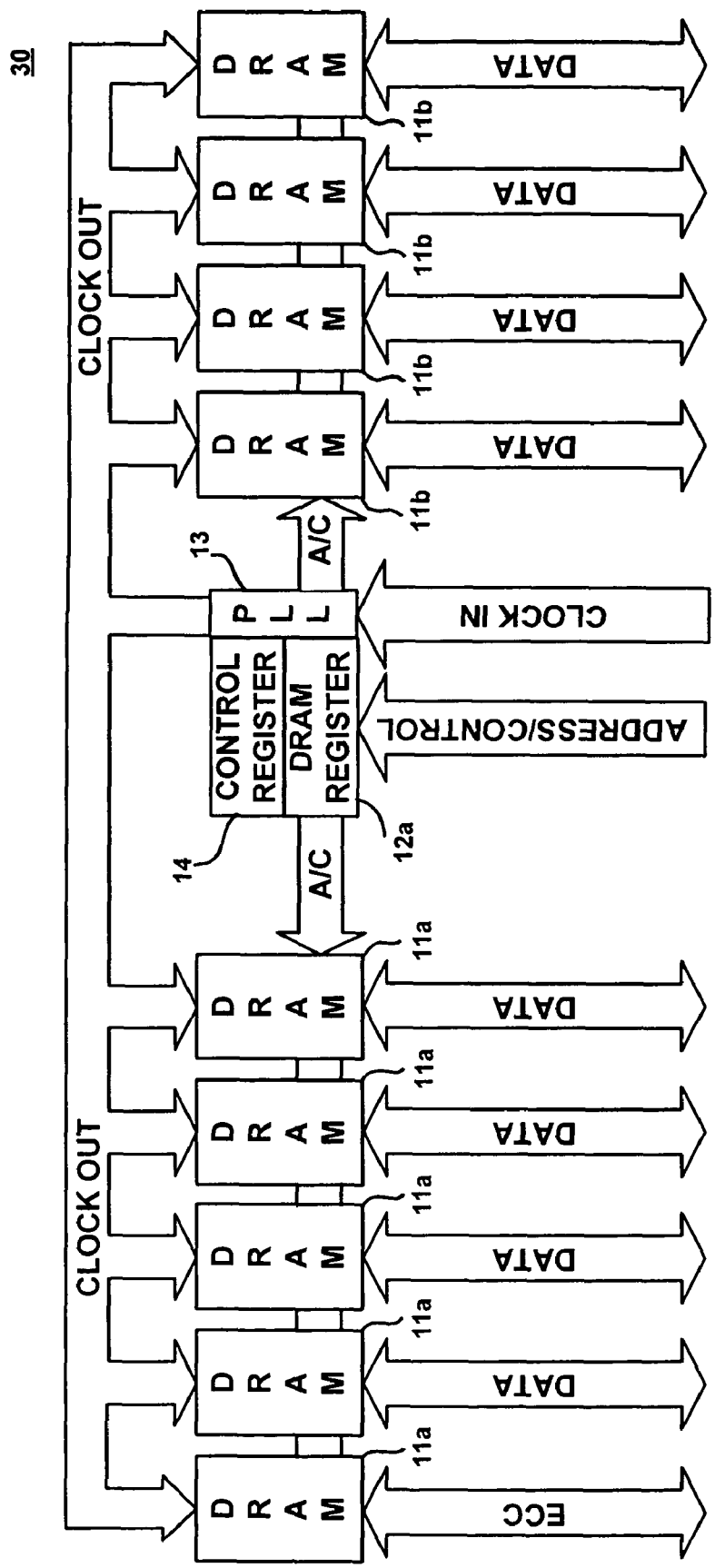
FIG. 8 is a block diagram depicting the main components of a registered dual in-line memory module according to one embodiment of the invention.

FIG. 8 is a block diagram depicting the main components of registered DIMM 30, together with representations of the signals communicated between the components, according to one embodiment of the invention. The primary difference between registered DIMM 30 depicted in FIG. 8 and registered DIMM 20 depicted in FIG. 2 is that PLL component 13 is integrated into a single component with control register component 14 and DRAM register component 12a. This arrangement allows control bits stored in control register component 14 to be programmed to set features and operating modes of PLL component 13 in addition to DRAM register 12a.

Figure 9:
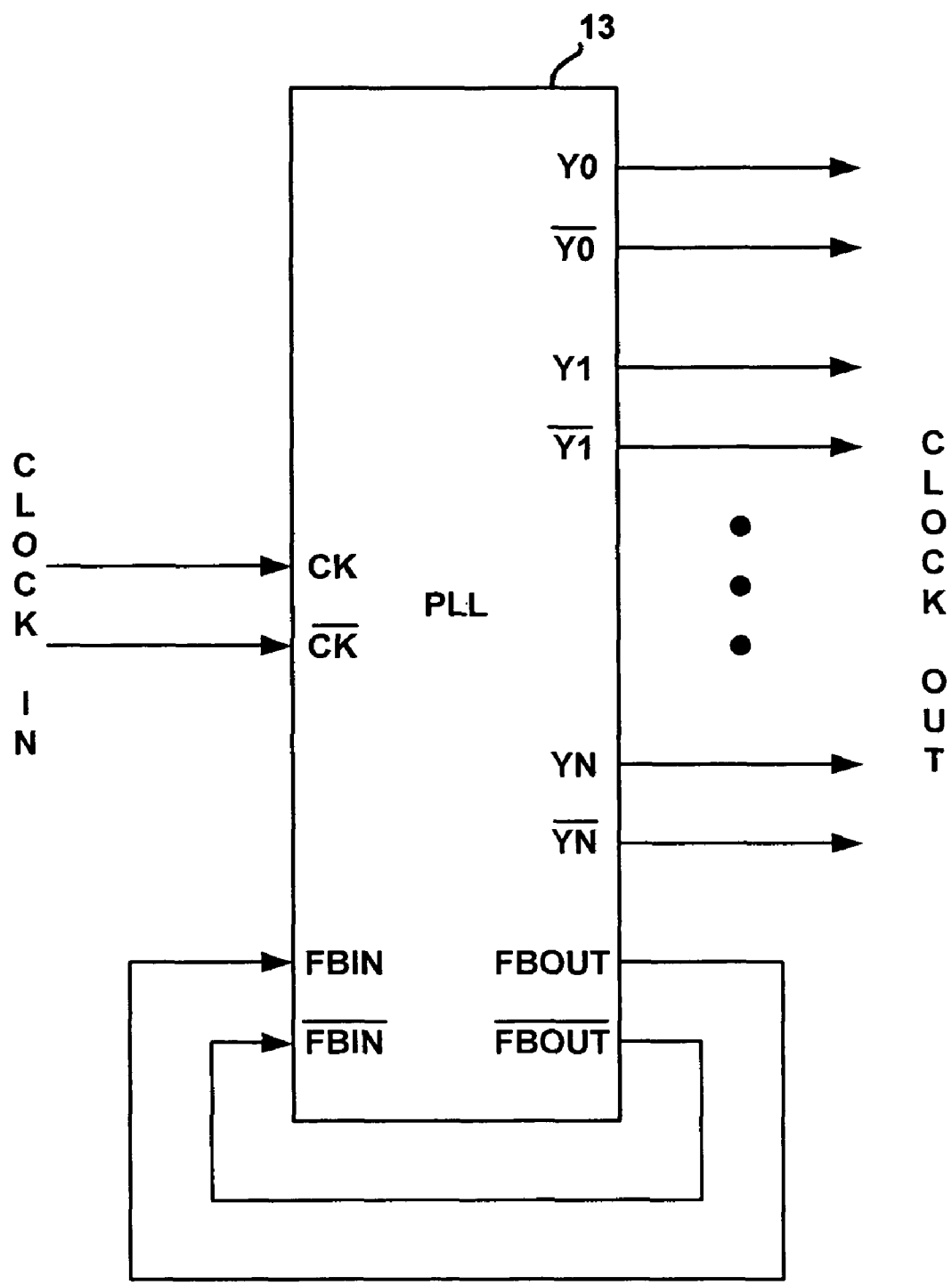
FIG. 9 a block diagram depicting the input and output signals of a phase-locked loop.

FIG. 9 is a block diagram depicting PLL component 13 together with representations of the clock inputs and outputs and feedback signals used by PLL component 13 to phase lock the clock out signal to the clock in signal. Using designs known to those skilled in the art, PLL component 13 distributes clock signals Y0/$\overline{Y0}$ to YN/$\overline{YN}$ to DRAM chips 11a and 11b, control register component 14 and DRAM register component 12a. The distributed signals represent the CLOCK OUT signal shown in FIG. 8 and are generated based on the input clock signals CK/$\overline{CK}$, which represents the CLOCK IN signal in FIG. 8. Feedback signals output from FBOUT/$\overline{FBOUT}$ to FBIN/$\overline{FBIN}$ are used to phase lock the CLOCK OUT signal to the CLOCK IN signal.

Using multiple control bits stored in control register component 14, various power saving features can be implemented by the system memory controller driving appropriate address and control signals to program values in the control bits. One such feature is the ability to disable PLL clock outputs Y0/$\overline{Y0}$ to YN/$\overline{YN}$ individually. This feature allows clock outputs not being used in the registered DIMM to be disabled by programming values into control bits associated with those clock outputs. In this manner, energy is conserved by not driving unnecessary clock outputs.

The invention also allows the system memory controller to place PLL component 13 in other power saving modes. For example, system memory controller can disable all of the clock outputs by programming appropriate values into the control bits associated with each clock output. In this power saving mode, the input clock signals CK/$\overline{CK}$ and the feedback signals continue to run, which allows normal operation of PLL component 13 to resume relatively quickly. Another power saving mode disables all of the clock output signals and the feedback signals by programming appropriate values in the associated control bits. This conserves more power than the previous mode in which the feedback signals continue to operate.

The features described above represent only some of the functionality and performance enhancements that are attainable with the present invention. Other possible features in an expandable feature set include drive strength control, parity/ECC enablement, rank multiplication logic control, on-die termination timing control. One skilled in the art will recognize other features and improvements within the scope of the invention.

As described above, the present invention expands the feature set available from a DRAM register component by utilizing programmable control bits to set operating modes and features. By using unique combinations of the address and control signals used by the system memory controller to access the DRAM chips, the invention is able to expand the feature set without requiring additional pins on the registered DIMM.

The foregoing description of the invention illustrates and describes the preferred embodiments of the present invention. However, it is to be understood that the invention is capable of use in various other combinations and modifications within the scope of the inventive concept as expressed herein, commensurate with the above teachings, and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the scope of the invention, which should be interpreted using the appended claims.

What is claimed is:

1. A registered dual in-line memory module, comprising:
   a plurality of random access memory chips;
   a DRAM register configured to receive first address signals and first control signals from a memory controller via a plurality of pins and distribute second address signals and second control signals to the plurality of random access memory chips in accordance with the first address signals and first control signals; and
   a control register configured to store a plurality of control bits for selecting one of a plurality of operating modes of the DRAM register, each operating mode uniquely influencing the second address signals and the second control signals, wherein the control bits are programmable using combinations of a set of address and control signals received by the DRAM register from the memory controller via the plurality of pins.

2. The registered dual in-line memory module according to claim 1, wherein the control bits are organized into one or more control words.

3. The registered dual in-line memory module according to claim 2, wherein the one or more control words are selectable for programming using signals received from the memory controller.

4. The registered dual in-line memory module according to claim 1, wherein the DRAM register and the control register are integrated in a single component.

5. The registered dual in-line memory module according to claim 1, wherein the DRAM register is configurable to invert the second address signals distributed to a first group of the plurality of random access memory chips in response to a selected operating mode.

6. The registered dual in-line memory module according to claim 1, further comprising a phase-locked loop configured to distribute a clock signal locked on an input signal to the plurality of random access memory chips, the DRAM register and the control register via a plurality of clock outputs, wherein the phase-locked loop is configurable to disable one or more of the clock outputs in response to a selected operating mode.

7. The registered dual in-line memory module according to claim 6, wherein the phase-locked loop is configurable to disable a feedback signal and all of the clock outputs in response to a selected operating mode.

8. The registered dual in-line memory module according to claim 6, wherein the phase-locked loop and the control register are integrated in a single component.

9. The registered dual in-line memory module according to claim 1, wherein the DRAM register is configurable to float at least one of the outputs used to distribute the second address and second control signals to the plurality of random access memory chips in response to a selected operating mode.

10. The registered dual in-line memory module according to claim 9, wherein the DRAM register is configurable to float the at least one of the outputs to a voltage that matches a terminating voltage of a bus not in use.

11. The registered dual in-line memory module according to claim 1, wherein an output timing of the DRAM register is set at a multiple of an input timing of the DRAM register in response to a selected operating mode.

12. The registered dual in-line memory module according to claim 1, wherein the drive strength of the DRAM register is configurable in response to a selected operating mode.

13. The registered dual in-line memory module according to claim 1, wherein parity control used to check data received by the dual in-line memory module is configurable in response to a selected operating mode.

14. The registered dual in-line memory module according to claim 1, wherein the first address signals and first control signals include a first address valid window and the second address signals and second control signals include a second address valid window, and wherein one of the plurality of operating modes configures the second address valid window to be a multiple of the first address valid window.

15. The registered dual in-line memory module according to claim 14, wherein the dual in-line memory module is configured with a first and a second DRAM register, wherein the first address signals and first control signals include a first set of the first address valid windows and a second set of the first address valid windows, and wherein the first set of the first address valid windows is used to drive the first address signals to the first DRAM register and the second set of the first address valid windows is used to drive third address signals to the second DRAM register.

16. A method for setting an operating mode of a registered dual in-line memory module, comprising the steps of:
receiving at a DRAM register a plurality of signals asserted by a memory controller via a plurality of address and control pins configured to receive signals from the memory controller;
decoding the plurality of signals to identify a plurality of control bits of a control register;
programming control bit values into the identified plurality of control bits based on the asserted plurality of signals to select one of a plurality of operating modes in accordance with an arranged set of the control bit values,
wherein the DRAM register is further configured to receive first address signals and first control signals from the memory controller via the plurality of pins; and
providing second address signals and second control signals to a plurality of random access memory chips in accordance with the first address signals and the first control signals and the selected one of the plurality of operating modes.

17. The method according to claim 16, wherein the control bits are organized into one or more control words which are identified in the decoding step.

18. The method according to claim 16, wherein one of the plurality of operating modes configures the DRAM register to invert the second address signals distributed to a first group of the plurality of random access memory chips.

19. The method according to claim 16, wherein one of the plurality of operating modes disables one or more clock outputs of a phase-locked loop configured to distribute a clock signal locked on an input signal to the plurality of random access memory chips, the DRAM register and the control register via a plurality of clock outputs.

20. The method according to claim 19, wherein one of the plurality of operating modes disables a feedback signal of the phase-locked loop and all of the clock outputs.

21. The method according to claim 16, wherein one of the plurality of operating modes floats the outputs of the DRAM register used to distribute the second address signals to the plurality of random access memory chips.

22. The method according to claim 16, wherein one of the plurality of operating modes configures the output timing of the DRAM register to be a multiple of an input timing of the DRAM register.

23. The method according to claim 16, wherein one of the plurality of operating modes configures a drive strength of the DRAM register.

24. The method according to claim 16, wherein one of the plurality of operating modes configures parity control used to check data received by the dual in-line memory module.

25. A registered dual in-line memory module, comprising:
a plurality of random access memory chips; and
a DRAM register having a plurality of pins and internal control bits, the internal control bits programmable by a set of address and control signals received via the plurality of pins,
wherein the DRAM register component is configured to operate in a selected one of a plurality of operating modes based on an arranged set of programmed internal control bits,
wherein the DRAM register component is configured to receive first address signals via the plurality of pins and to distribute second address signals to the plurality of random access memory chips in accordance with the first address signals, and
wherein the DRAM register component is configured to invert and distribute the second address signals to a first group of the plurality of random access memory chips when a first operating mode is selected, disable a clock output when a second operating mode is selected, float at least one output used to distribute the second address signals to the plurality of random access memory chips to a voltage that matches a terminating voltage of a bus not in use when a third operating mode is selected, and configure a drive strength of the DRAM register component when a fourth operating mode is selected.

* * * * *